United States Patent [19]

Hosoki et al.

[11] 4,379,250

[45] Apr. 5, 1983

[54] FIELD EMISSION CATHODE AND METHOD OF FABRICATING THE SAME

[75] Inventors: Shigeyuki Hosoki, Hachioji; Shigehiko Yamamoto, Tokorozawa; Hideo Todokoro, Hinodemachi; Susumu Kawase, Higashimurayama; Yasuharu Hirai, Chofu, all of Japan

[73] Assignee: Hitachi, Ltd., Tokyo, Japan

[21] Appl. No.: 198,176

[22] Filed: Oct. 17, 1980

[30] Foreign Application Priority Data

Oct. 19, 1979 [JP] Japan .................................. 54-134167
Oct. 24, 1979 [JP] Japan .................................. 54-136410
Apr. 9, 1980 [JP] Japan .................................. 55-45591

[51] Int. Cl.³ ............................................... H01J 1/16
[52] U.S. Cl. .................................. 313/336; 313/346 R; 427/77
[58] Field of Search ........................... 427/77; 156/20; 313/346, 318, 336

[56] References Cited

U.S. PATENT DOCUMENTS

| | | | |
|---|---|---|---|
| 3,809,899 | 5/1974 | Baker et al. ........................ | 313/336 |
| 3,814,975 | 6/1974 | Wolfe et al. ........................ | 313/346 |
| 4,137,476 | 1/1979 | Ishii et al. ......................... | 313/346 |
| 4,324,999 | 4/1982 | Wolfe ................................. | 313/336 |
| 4,325,000 | 4/1982 | Wolfe ................................. | 313/336 |

Primary Examiner—Harold A. Dixon
Attorney, Agent, or Firm—Antonelli, Terry & Wands

[57] ABSTRACT

A field emission cathode of the present invention is characterized by the possession of a special layer which is adsorbed onto the surfaces of a tip that is joined to the top of a hairpin-shaped filament.

This layer is formed by adsorbing a selected metal via oxygen to a thickness which does not exceed the thickness of the monolayer of atoms.

The metal will be selected from chromium, aluminum, cerium, magnesium, titanium, silicon, zirconium or hafnium.

The field emission cathode features that the electrons are emitted in a concentrated manner from a particular crystal plane among the crystal planes of the tip.

Therefore, it is possible to obtain a field emission cathode having very small emission angle of electrons.

18 Claims, 22 Drawing Figures

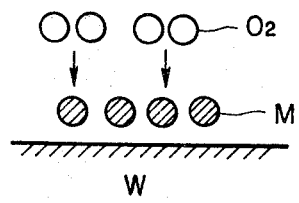
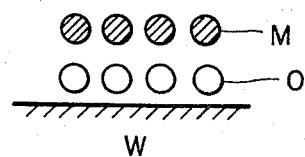
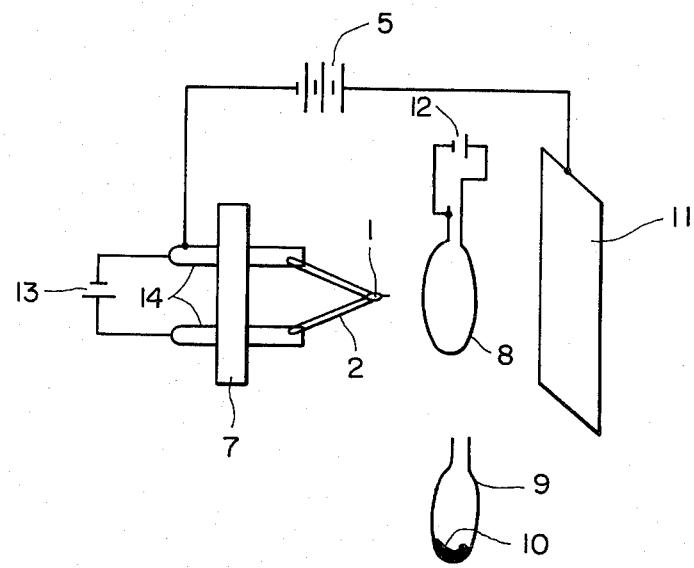

FIG. 12A
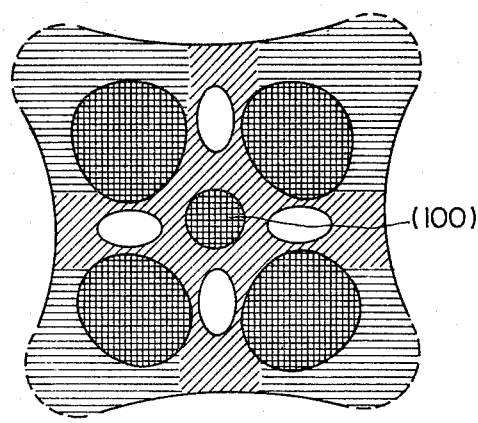
(100)
FIG. 12B
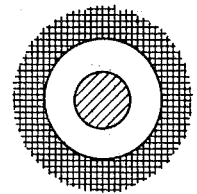
FIG. 12C
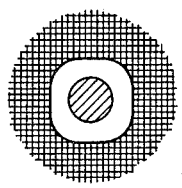
FIG. 12D
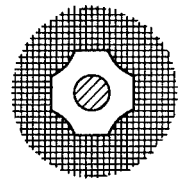
FIG. 12E
CURRENT DENSITY
  1
  $1/2 \sim 1/4$
  $1/10 \sim 1/100$
  $\sim 0$

FIELD EMISSION CATHODE AND METHOD OF FABRICATING THE SAME

FIELD OF THE INVENTION

The present invention relates to a field emission cathode which is used for an electron gun for electron beam instruments such as scientific instruments and electron beam lithography instruments, and to a method of fabricating the field emission cathode.

BACKGROUND OF THE INVENTION

In the field emission cathode, the electrons are emitted by applying a negative potential to a needle-like tip and applying a positive potential to an opposing anode. In this case, a field emission electron micrograph can be obtained if a fluorescent screen is employed for the anode. The field emission electron micrograph usually exhibits a geometrical pattern which reflects crystallographical regularity of a metal which forms the tip. If defined in terms of an emission angle, the micrograph appears in a region of about 1 rad. as viewed from the tip.

When the field emission cathode is put into practical use, however, only a portion of the above-mentioned wide emission angle is utilized. The emission angle will be explained below with reference to a schematic diagram of FIG. 1 which shows an electron optical system for electron beam convergence in an electron gun which employs the field emission cathode. A needle-like field emission cathode tip 1 which is welded to the center of a hair-pin filament 2 is impressed with a voltage of power supply 5 which is negative with respect to a first anode 3, and electrons are emitted from the tip of the cathode 1 due to the field emission. In this case, the emitted electrons spread to about 1 rad. in terms of emission angle as mentioned above. The electron ray 16 which has passed through an aperture 15 of the first anode 3 is converged by the effect of electrostatic lens which is produced by a potential difference across the first anode 3 and a second anode 4 that are connected to a power supply 6, and offers a fine spot of electron beam on a suitable convergence plane 17. It is possible to obtain more fine spot of electron beam by repeating the convergence by combining magnetic lenses. Here, the emitted electrons which can be utilized as an electron probe 16 is confined by the aperture of the first anode 3 because of the reasons mentioned below. Namely, an electron optical lens has aberrations which cannot be corrected, irrespective of whether it may be an electrostatic lens or a magnetic lens. Among them, a spherical aberration occupies a majority portion. Since the quantity of spherical aberration is so great, the electron beam 16 being utilized is limited to the vicinity of an optical axis 18. Further, if a spherical abberation coefficient is denoted by Cs and an aperture angle of the electron beam 16 by $\alpha$, the aberration is given by $Cs\alpha^3$. Therefore, to obtain a fine electron beam 16 minimizing the aberration, the aperture angle $\alpha$ must be restricted to a small region. In a practical apparatus, the aperture angle $\alpha$ is about $\alpha \lesssim 10^{-3}$ rad. If the current density distribution of the first anode 3 is assumed to be uniform, the ratio of a solid angle (lsr) of the total electron emission to a solid angle ($\pi\alpha^2$) of the electron beam 16 which passes through the aperture 15 becomes equal to a ratio of the total current in the field emission to the current of the fine electron beam 16. In practice, however, the current density is not uniform in the first anode 3 due to the crystallographical regularity. Further, the axial azimuth of the tip 1 is so selected that a current density of field emission electron micrograph becomes great at the central portion. In the above-mentioned case, therefore, the ratio of the whole current to the current being utilized will be about 1000 to 1.

With the practical apparatus, on the other hand, it is required to converge the electron ray as finely as possible and to draw a current (hereinafter referred to as probe current) as greatly as possible. For example, to obtain a probe current of the order of 0.1 $\mu$A, the total emission current of the order of 1 mA is necessary.

Under a constant vacuum pressure, on the other hand, the field emission current becomes stable with the decrease in the current. The current fluctuation increases with the increase in the current; i.e., the field emission current becomes unstable. Further, when a predetermined current is drawn, the current becomes stable when vacuum pressure is lower. Therefore, even when it is attempted to obtain a great total emission current, the current fluctuation becomes so great that the apparatus becomes unusable. In practice, even when the vacuum pressure in an ordinary vacuum chamber is about $5 \times 10^{-10}$ Torr, it is extremely difficult to stably draw the field emission current of 100 $\mu$A for extended periods of time. Accordingly, it is difficult to obtain larger probe current.

SUMMARY OF THE INVENTION

The object of the present invention therefore is to provide a novel field emission cathode which stably produces a large probe current, and to provide a method of fabricating the field emission cathode.

In order to accomplish the above-mentioned object according to the present invention, a metal is adsorbed via oxygen onto surfaces of the cathode tip to such a thickness that does not exceed the thickness of a monolayer of atoms, the metal having a work function which is smaller than that of a metal constituting the cathode tip and an oxide thereof being capable of exhibiting resistance against high temperatures, so that the work function on the surfaces of the cathode tip is decreased.

In other words, the present invention was accomplished based upon the fact that the field emission electrons tend to be easily generated within a particular narrow region of crystal planes of the cathode tip when the monolayers of oxygen gas molecules and metal atoms are adsorbed on the surfaces of the needle-like field emission cathode tip. Namely, according to the field emission cathode of the present invention, the total emission current can be restrained within a region of about $\frac{1}{4}$ rad. or smaller in terms of the emission angle in the field emission.

BRIEF DESCRIPTION OF THE DRAWINGS

FIGS. 3A and 3B are schematic diagrams for illustrating the adsorbing state in the field emission cathode of the present invention;

FIG. 4 is a diagram illustrating a method of fabricating the field emission cathode according to the present invention;

FIG. 11 and FIGS. 12A to 12E are schematic diagrams of the field emission electron micrograph of the field emission cathode of FIG. 9C.

DETAILED DESCRIPTION

Figure 1:
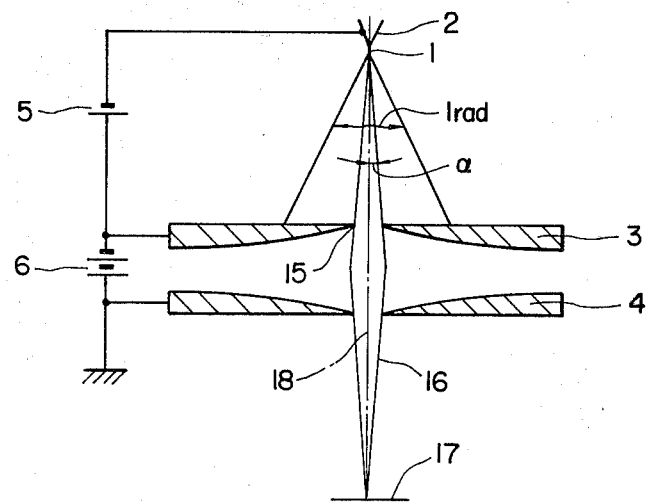
FIG. 1 is a diagram illustrating a general setup of an optical system for electron beam convergence in an electron gun which employs a field emission cathode.

The material for making a needle-like cathode for use in the present invention should be a high temperature resistant metal such as tungsten or molybdenum which retains the shape of a needle-like tip even after it is subjected to high temperatures and which is capable of cleaning the surfaces of the tip. Further, the metal material must be capable of being processed into a needle-like tip by the electrolytic polishing. A metal is vaporized onto clean surfaces of the tip to a thickness equal to or greater than the thickness of the monolayer of atoms, the metal having a work function which is smaller than that of the material of the tip and the oxide thereof being capable of exhibiting resistance against high temperatures. Namely, when the tip is made of tungsten (W) or molybdenum (Mo), it is coated with aluminum (Al), chromium (Cr), cerium (Ce), magnesium (Mg), titanium (Ti), silicon (Si), zirconium (Zr), or hafnium (Hf) to a thickness which is equal to or greater than the thickness of the monolayer of atoms. Then, the oxygen gas is introduced into a vacuum chamber where the tip is placed so that a monolayer of oxygen gas molecules is adsorbed on the surfaces of the tip. In the case of the oxygen gas, this aeration corresponds to about 1 L (Langmuir). Therefore, the aeration should be performed for 1 second when the pressure is $1\times10^{-6}$ Torr, and 100 seconds when the pressure is $1\times10^{-8}$ Torr. Thereafter, the oxygen gas is evacuated, and the tip is heat-treated for 10 to 60 seconds at a temperature of 1300° to 1500° C. though it may vary depending upon the substance being vaporized, under vacuum condition in which the field emission can be effected, thereby to form the tip as contemplated by the present invention. The thus prepared needle-like cathode tip made of tungsten or molybdenum emits electrons chiefly from the plane (100) only, whereby there is obtained a field emission electron microscope of which the emission angle is reduced to about ¼ rad.

The principle of the present invention has not yet been fully clarified in detail, since the radius of curvature of the tip is as small as about 1000 angstroms, and the tip on which is adsorbed atoms or molecules to a thickness comparable to a monolayer exhibits properties which are dependent upon the crystal planes. Fundamentally, however, the principle of the present invention is considered to be as follows.

To simplify the description, let it be considered that the tip is made of tungsten. When a substance having a work function smaller than that of tungsten is vaporized in the surface of tungsten, the work function on the surface varies as indicated by a curve 19 of FIG. 2. Namely, when the thickness of the vaporized metal is about 0.7 monolayer of atoms, the work function becomes the smallest with respect to the work function $\phi w$ of tungsten, and gradually increases again. The work function nearly saturates when the thickness of the vaporized metal exceeds that of the monolayer of atoms, and then gradually approaches the work function $\phi_M$ of the vaporized metal. This is due to the fact that the surface potential on the surface of tungsten varies by the adsorption of vaporized metal, as is generally accepted as follows. Namely, the phenomenon which takes place on the surface of tungsten is a many-body problem resulting from the bonding of many atoms in the surface and atoms which are adsorbed, and is considered to a system of the bonding of an atom in the surface with an atom which is adsorbed. The electric dipole moment which develops between the atom in the surface and the atom which is adsorbed, can be expressed as follows based upon the concept of electronegativity as proposed by Malone.

$$\mu = Xad - Xo \quad (1)$$

Here, Xad denotes the electronegativity of the vaporized metal and Xo denotes the electronegativity of tungsten. On the other hand, there is a relation of Gordy-Thomas between the electronegativity Xo and the work function $\phi$, which can be expressed as follows:

$$Xo = 0.44\phi - 0.15 \quad (2)$$

The change in work function $\Delta\phi$ which is affected by the adsorption is proportional to the magnitude of the dipole moment $\mu$ and the number n of atoms adsorbed per unit area and can, hence, be expressed as $$\Delta\phi = 2\pi\mu n = 2\pi n(Xad - Xo) \quad (3)$$

Figure 2:
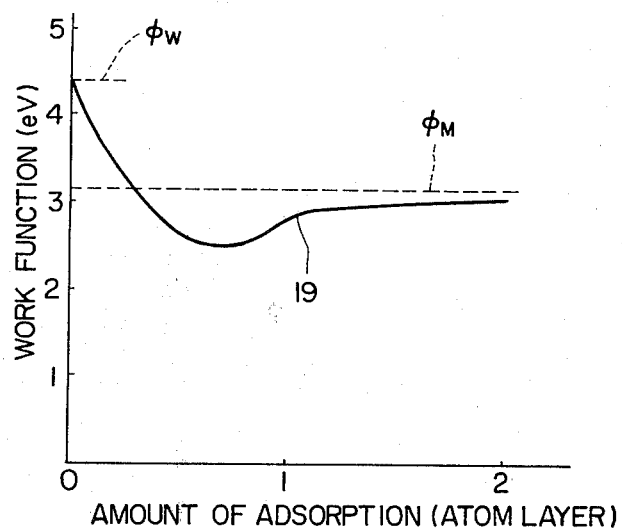
FIG. 2 is a graph illustrating a relation between the amount of adsorption and the work function to explain the principle of the present invention.

Therefore, the change in the work function as shown in FIG. 2 is produced by the vaporization of a metal having a smaller work function than that of tungsten, i.e., produced by the vaporization of a metal having a small electronegativity before the effect of adsorption turns out to be positive. The adsorption of the monolayer of atoms means that the adsorption is effected to a degree which meets the atomic density on the surface of tungsten. When the metal is adsorbed to an amount greater than the monolayer of atoms, the number n of atoms in the equation (3) does not increase. Further, the work function takes minimum values over the atom layer of 0.7 to 1 presumably due to the fact that the adsorbed atoms which can be diffused on the tungsten surface and which have a considerably large degree of freedom, enable the electric dipole (moment $\mu$) to be increased.

Below is considered the case when not only the metal but also oxygen gas molecules are adsorbed. When the metal M is vaporized first on the surface of tungsten and then oxygen gas molecules are adsorbed as shown in FIG. 3A, it is considered that the oxygen atoms (molecules) are arrayed between tungsten and the vaporized metal M due to the chemisorption reaction which resembles ordinary oxidation though the arrangement may differ depending upon the reactivity of the vaporized metal M to oxygen gas $O_2$. The metal which is reactive with oxygen develops the above reaction under conditions close to room temperature. FIG. 3B, however, illustrates a model which is not to exemplify the details of bonding.

With the arrangement as represented by the model of FIG. 3B, which is different from the adsorption of the metal only, it is considered that the work function varies more greatly as considered from the magnitude of dipole moment. When the ionic radius of the adsorbed metal atom is denoted by $r_M$, and the ionic radius or the radius of covalent bond of the oxygen atom by $r_G$, the change in the work function $\phi$ can be given by the following relation, $$\Delta\phi = 2\pi\eta(Xad - Xo)\frac{r_G + r_M}{r_G} \quad (4)$$

If it is assumed that $r_G$ is equal to $r_M$, the variation $\Delta\phi$ may nearly double as compared with when the metal atom is adsorbed.

Even when polycrystals are used, the needle-like tip will be included in a large grain in a spherical region of a radius of curvature of about 1000 angstroms due to the grain growth by the heating. Namely, the tip surface can be regarded as a single crystal surface in any cases. As is well known, the work function of tungsten varies depending upon the crystal planes and, therefore, the work function $\phi$ or the electronegativity Xo must strictly be indicated as $\phi_{hkl}$ or $X_{hkl}$ depending upon the crystal planes. Table 1 shows values for the crystal planes. With the adsorption of W-O-M being occurred as shown in FIG. 3B, if the work function uniformaly changes on each of the crystal planes, there is no change in the distribution of field emission electron micrograph even after the adsorption; the electric field for drawing the current is simply decreased. When the work function varies as given by the equation (4), however, the distribution of field emission electron micrograph becomes apparently different. Further, when the monolayers of oxygen and metal are adsorbed, the number of absorbed atoms determines an atomic density on the surface of each of the crystal surfaces provided the sticking probability of tungsten is supposed to be 1 on each of the crystal planes, and possesses values as shown in Table 1. Table 1 illustrates calculated examples when cerium or titanium is adsorbed onto oxygen adsorbed metal.

TABLE 1

|  | Crystal plane | | | | |
|---|---|---|---|---|---|
|  | (110) | (211) | (100) | (111) | (611) |
| Clean W surface Work function (eV) | 5.10 | 4.69 | 4.64 | 4.61 | 4.64 |
| Surface density ($\times 10^{14}/cm^2$) | 14.1 | 8.2 | 10.0 | 5.8 | 3.3 |
| Electronegativety (Pauling unit) | 2.10 | 1.92 | 1.89 | 1.88 | 1.89 |
| Work function W—O—Ce (eV) | 2.1 | 3.3 | 3.0 | 3.7 | 4.1 |
| Work function W—O—Ti (eV) | 3.1 | 3.9 | 3.7 | 4.1 | 4.3 |

The calculated results indicate that the plane (110) has the smallest work function and the plane (100) has the second smallest work function. This contradicts the fact that the emission electron micrograph is chiefly limited to the plane (100) in the case of tungsten, because of the reasons mentioned below. Namely, the calculation was performed with the sticking probability as 1 in each of the crystal planes and the atomic density on the surface as n. In practice, however, it is considered that the sticking probability differs depending upon the crystal planes. That is, the plane (110) is thermally most stable among the crystal planes of tungsten and offers the most flat and wide surface if it is used as the needle-like tip. It is known that the sticking probability decreases on such a plane, and the work function on the plane (110) is not practically as small as the values of Table 1. There are no serious differences with regard to other planes. Because of the reasons mentioned above, it will be semiquantitatively understood that the emission electron micrograph is restricted chiefly to the plane (100) of the tungsten tip when monolayers of a metal having a work function smaller than that of tungsten and oxygen are adsorbed. The work functions on the plane (100) after the metal is absorbed of Table 1 are in good agreement with values that are experimentally found by the Fowler-Nordheim plot of field emission.

These phenomena hold true even for molybdenum which has a work function that is slightly smaller than that of tungsten. The same holds true even for other metals with regard to that the emission electron micrograph is limited to a particular crystal plane, although the emission electron micrograph may often appear on a different crystal plane.

Further, the monolayers consisting of a metal to be adsorbed and oxygen of the present invention are chemically bonded as is apparent by the analysis of surface analyzer such as X-ray excited photoelectron spectroscopy. In other words, the monolayer of atoms can be regarded as a film of a metal oxide. When the metal is adsorbed and oxidized to a thickness greater than that of the monolayer of atoms, however, the work functions are increased and the electrons are not emitted unless very high electric field is applied. Therefore, the monolayer consisting of a metal to be adsorbed and oxygen of the present invention is greatly different from a thin film of an ordinary oxide which is formed on the surface of the tip.

Figure 5A:
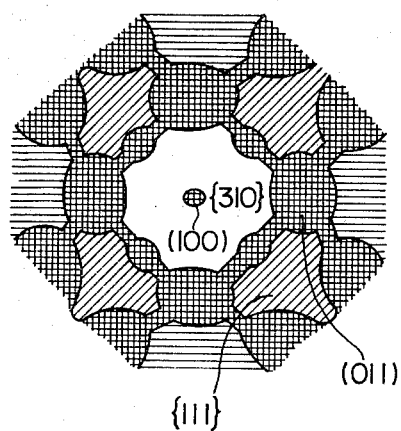
FIGS. 5A and 5B are schematic diagrams illustrating field emission electron micrographs of the field emission cathode according to the present invention.

The field emission cathode according to the present invention will be concretely illustrated below by way of an embodiment. FIG. 4 illustrates an embodiment of the field emission cathode of the present invention. Hairpin-shaped tungsten wire 2 of a diameter of 0.15 mm is welded to stems 14 made of a cobalt-nickel alloy that are secured to a glass base 7. A <100> oriented single crystal 0.15 mm in diameter which is welded to a central portion of the hairpin-shaped tungsten wire 2 is electrolytically polished using an aqueous solution of NaOH, to prepare a tip 1. An electric current is then permitted to flow into the hairpin-shaped tungsten wire 2 to instantaneously heat the tip 1 at a high temperature in order to clean the surfaces thereof in an ultra-high vacuum chamber. In this case, use of fluorescent screen 11 as an anode makes it possible to obtain a field emission electron micrograph on a clean tungsten surface with the plane (100) as a center as shown in FIG. 5A, in which dark portions have a small current density, and portions of lateral lines, portions of tilted lines and white portions have densities which increase in the order mentioned. The region in which the electron micrograph is seen corresponds to an aperture of about 1 rad. (1sr in solid angle) which is shown in FIG. 1 as an emission angle. A titanium wire 8 of a diameter of 0.3 mm is formed into a circle 10 to 15 mm in diameter at a position about 5 mm away from the tip 1 toward the direction of the anode 11. An electric current is supplied from a power supply 12 to the titanium wire 8 to heat it at 1400° to 1500° C., whereby titanium is vaporized onto the tip 1.

Figure 6:
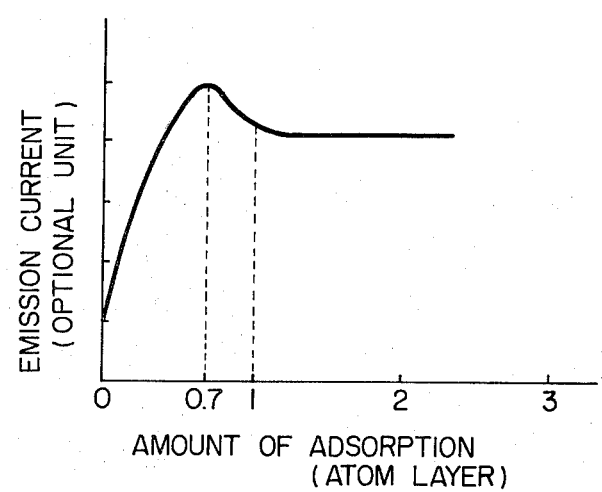
FIG. 6 is a graph illustrating a relation between the amount of adsorption and the field emission current of the field emission cathode of the present invention.

The amount of vaporization can be controlled in the following way. A high voltage is applied to the tip 1 from the power supply 5, such that an electric current received by the fluorescent screen 11 which is the anode will be about 0.1 $\mu$A. As titanium is evaporated, the electric current increases according to the work function which is illustrated in FIG. 2; i.e., the electric current possesses a maximum value as shown in FIG. 6 quite contrary to the pattern of work function of FIG. 2, and approaches a predetermined value. A point of a maximum value can be regarded as 0.7 monolayer of atoms, or the monolayer of atoms can be directly found from a point of inflection of FIG. 6. Titanium should be vaporized in such an amount as to form a minimum monolayer of atoms. Excess of deposition by vaporization can be raduced through a subsequent step of evaporation. Thereafter, oxygen gas is introduced to effect the aeration of at least about 1 Langmuir. The oxygen gas is then evacuated to restore the initial vacuum pressure, and electric current is permitted to flow into a tungsten filament 2 from a power supply 13 to heat the tip 1. The heating temperature and the heating time vary depending upon the amount of titanium deposited by vaporization and the degree exposed to the oxygen gas, but should usually fall within a range of 1300° to 1500° C. for 10 to 60 seconds. Even when the heating temperature is lower than 1300° C., the processing can be effected to the same degree if the heating is performed for extended periods of time, which however, is inefficient. Further, the effect of heat treatment is not exhibited at lower than 800° C. Therefore, the heat treatment should be effected at a temperature of higher than 800° C. With the temperature being higher than 1500° C., on the other hand, the adsorbed layer will be destroyed if the heating is effected in excess of 60 seconds.

Figure 5B:
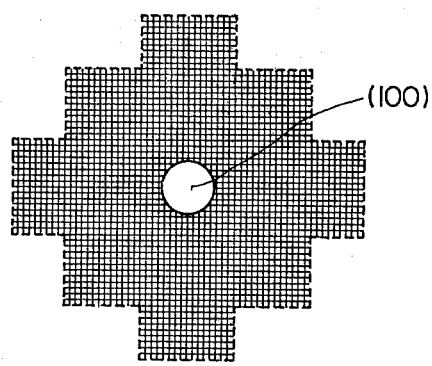

In a above-mentioned fabricating steps, furthermore, the tip 1 may be heated at a suitable temperature by feeding a current to the filament 2 to further promote the oxidation after the tip 1 has been exposed to the oxygen gas. FIG. 5B illustrates a field emission electron micrograph of the thus fabricated field emission cathode. In the electron micrograph on the clean surface of FIG. 5A, a current density is very small on the central plane (100), while in FIG. 5B, the electron micrograph is exhibited being restricted to a spot with the plane (100) as a center. The emission angle corresponds to the distribution of electron micrograph. Therefore, if the emission angle in FIG. 5A is 1 rad., the emission angle in FIG. 5B will be about 1/5 rad.

The same holds true even when a zirconium wire or a hafnium wire is used instead of the titanium wire, or even when the titanium wire, zirconium wire and hafnium wire are used being suitably combined together.

Referring to FIG. 4, another embodiment consists of employing a heater 9 made of a tungsten wire or the like 0.1 to 0.3 mm in diameter instead of the titanium wire 8.

In this case, a metal 10 consisting of any one of aluminum, magnesium, cerium, silicon or chronmium or a combination thereof, has been deposited by vaporization on the heater 9. Although the deposition amount by vaporization cannot be effected in the same manner as when the titanium wire is used, the temperature of the metal to be vaporized should be correctly measured to vaporize the monolayer of atoms relying upon the vapor pressure. The processing with regard to other respects is the same as that of the above-mentioned embodiment.

According to a further embodiment of the present invention, the metal is adsorbed not by the vaporization, but a water-soluble compound such as nitrate, i.e., $AlNO_3$ or $MgNO_3$, or carbonate, is dissolved in an aqueous solution to a saturated state, and the tip 1 is immersed in the aqueous solution. After the water has been dried, the tip 1 is introduced into the apparatus where gases are evacuated in a customary manner. By effecting the heat treatment at 1300° to 1500° C. under high vacuum condition, the emission electron micrograph can be obtained being limited to the plane (100) only without the need of introducing the oxygen gas. However, since oxygen may often be in short supply, the treatment which corresponds to the above-mentioned exposure to oxygen gas is performed. According to this embodiment, oxygen is formed by the decomposition $MgNo_3 \rightarrow MgO + NO_2$ by the heating, and exposure to oxygen gas is not often required.

The emission electron micrograph obtained by the above-mentioned embodiment gives an emission angle of ¼ to 1/5 rad. or smaller, and enables the efficiency of the total emission current to be very improved with respect to the probe current, and further makes it possible to obtain a large probe current, that was so far difficult to obtain, without the need of increasing the total emission current. When applied to an electron ray apparatus, the total emission current needs be 30 $\mu$A when it is attempted to draw a probe current of 0.1 $\mu$A with the aperture angle $\alpha$ of FIG. 1 being about $1 \times 10^{-3}$ rad. When an ordinary <310> oriented tip of tungsten or molybdenum which gives the greatest ratio of the total emission current to the probe current, is used, on the other hand, a total emission current of 1 mA is necessary to draw the same amount of probe current. In the general-purpose apparatus such as electron microscopes and electron beam lithography instruments, however, it is very difficult to stably draw a total emission current of as great as 1 mA from the field emission cathode, since there is limit in the art for establishing ultra-high vacuum state in the electron gun chamber.

The cathode of the present invention, on the other hand, makes it possible to easily obtain a large probe current that was so far difficult to obtain, as the above comparison teaches.

The tip employed in the present invention chiefly consists of tungsten or molybdenum. The tip, however, may be used being combined with any other material such as the below-mentioned metal that is to be adsorbed, provided it is adaptable as the field emission cathode.

The requirements in which the metal can be used for adsorbing is that (i) the metal should have a work function which is smaller than that of the tip material, that (ii) the oxide of the metal being adsorbed should be resistant against high temperatures, assuming the metal coupled with oxygen is equivalent to the oxide of this metal, in view of high temperature resistance and that (iii) the metal should be adsorbed by a method which is as simple as possible as illustrated in the foregoing embodiments.

The tip of the present invention has a small work function as compared with the tips of tungsten or molybdenum which are not particularly treated, and hence causes the emission current to be greatly decreased when it is used at room temperature. To minimize the drift of the current, the tip of the present invention should be used being heated at 750° to 100020 C. to obtain stable current characteristics for extended periods of time. The above-mentioned temperature range is determined in a way that (i) the lower limit in the heating temperature is determined relative to the decrease in the current which is caused by the residual gas molecules in vacuum adsorbed by the tip, i.e., so that the current will not decrease after a predetermined value has passed, and that (ii) the upper limit in the heating temperature is so determined that the monolayer consisting of a metal adsorbed and oxygen of the present invention will not be thermally decomposed.

When the <100> oriented single crystal is used for the tip composed of tungsten or molybdenum as mentioned in the foregoing, the center of emission angle comes into agreement with the optical axis to give great practical advantage. Depending upon the purposes, however, the center of <310> oriented emission angle may be slightly deviated from the optical axis.

Experiments were further performed concerning a relation between the heating temperature and the current characteristics of the field emission cathode when zirconium was used as a metal to be adsorbed. The following results were clarified.

Figure 7:
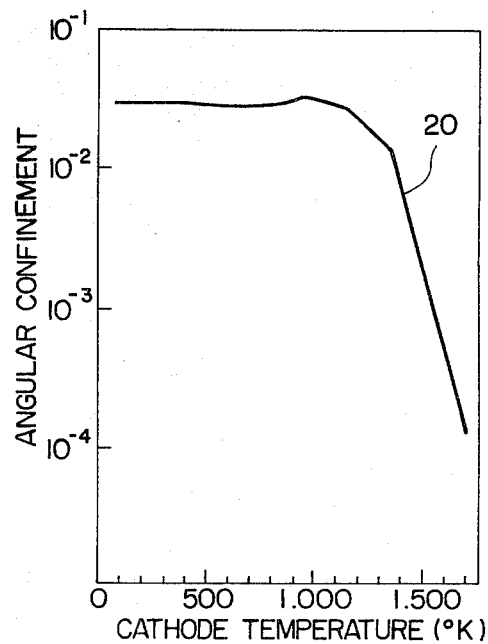
FIG. 7 is a graph illustrating a relation between the cathode temperature and the angular confinement of the field emission cathode according to the present invention.

FIG. 7 illustrates a relation between the cathode temperature and the angular confinement. The ratio of probe current having a central solid angle of $1.5 \times 10^{-4}$ sr relative to the total emission current is utilized as an index of the angular confinement. As will be understood from the locus of a curve 20, when the temperature of the cathode exceeds 1200° K., electrons increase by the thermionic emission in addition to electrons by the field emission, and the effect of angular confinement is abruptly dropped. Although not diagramatized, the probe current increases with the rise in the cathode heating temperature. When the temperature exceeds 1500° K., however, the probe current decreases due to the fact that the adsorbed layer of zirconium is destroyed under high-temperature conditions.

Figure 8:
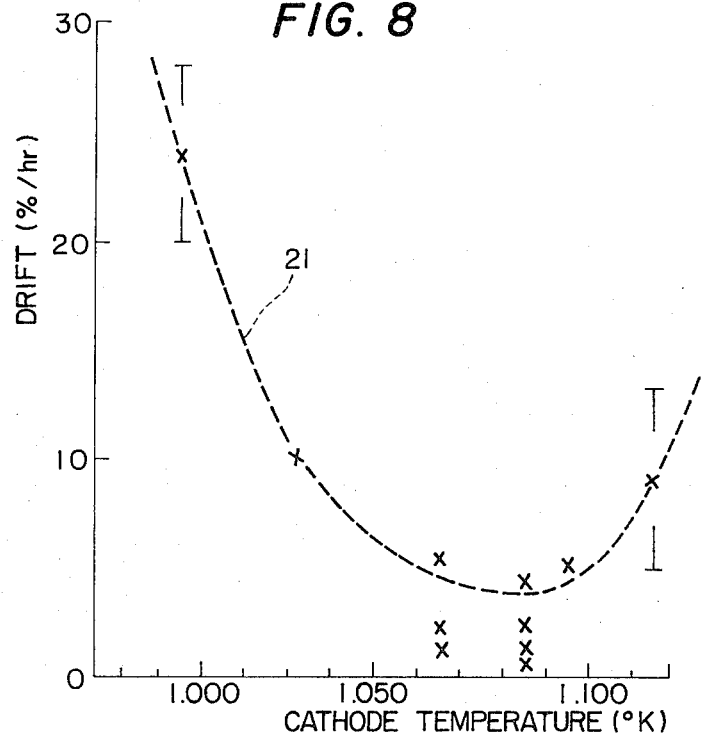
FIG. 8 is a graph illustrating a relation between the cathode temperature and the drift of the field emission cathode according to the present invention.

The unstable current which is drawn out, i.e., the drift indicates that the limit of the cathode temperature lies in a lower temperature range. FIG. 8 is a diagram of experimental results which illustrate a relation between the drift and the cathode temperature (brightness temperature). Here, the operation which is performed for more than 4 hours is regarded as long-time operation, and the operation is carried out under an ultra-high vacuum condition of $5 \times 10^{-9}$ Torr. As is obvious from the locus of a curve 21, the drift greatly increases when the cathode temperature exceeds 1110° K. When the operation is carried out under a high-vacuum condition of greater than $5 \times 10^{-9}$ Torr but smaller than $1 \times 10^{-8}$ Torr, the drift is maintained in a good condition at temperatures of up to 1250° K. As is apparent from FIG. 7, however, the angular confinement is decreased within this temperature range, and problem is imposed in practice. The drift, on the other hand, is increased even when the cathode temperature is decreased. The reason is because the residual gas in vacuum is adsorbed on the surface of the tip 1 to increase the work function. The lower vacuum pressure, the smaller the drift. The lower limit of the cathode temperature, however, is 1000° K. even under the vacuum pressure of about $1 \times 10^{-11}$ Torr which is the greatest value obtainable at the present moment. Namely, when the cathode is operated at a brightness temperature of from 1000° to 1110° K., it is possible to stably obtain an electron beam under a high-vacuum condition maintaining good angular confinement. The same holds true even when hafnium is used in place of zirconium.

In the field emission cathode to which is adsorbed the monolayer of atoms mentioned in the foregoing, the stability is improved when the tip is used being heated at a suitable temperature to decrease the drift of the emission current. The optimum heating temperature varies depending upon the material being used and the vacuum pressure. Further, since the adhesion is effected to a thickness of monolayer of atoms, the life will be shortened when the heating temperature is too high. When the metal deposited by vaporization has a relatively high melting point, however, the current becomes stable when heated at 1000° C. or higher. In order to maintain this condition for extended periods of time, the metal must be stably replenished at a rate that is dissipated by the vaporization, so that the monolayer of atoms is stably adsorbed on the tip surfaces at all times even when the tip is heated at high temperatures.

For this purpose according to the embodiment of the present invention, there is produced a field emission cathode of the type in which the monolayer of atoms is adhered, by adsorbing monolayers of molecular oxygen gas and metal atoms on the tip surface of the field emission cathode, so that field emission electrons are generated on a narrow region of a particular crystal plane of the tip, thereby to restrain the emission angle to about ¼ rad., i.e., to restrain the total emission current. Further, in order that the metal is stably replenished at all times by a rate at which the metal is dissipated by vaporization even when the field emission cathode is operated at high temperatures, a fine metallic wire having resistance against high temperatures is formed into a filament of the shape of a hairpin, a metal member is intermingled with the filament, the metal having a work function which is smaller than that of the tip attached to the top of the filament and an oxide thereof being capable of exhibiting resistance against high temperature, and the metal member is heated under high vacuum condition thereby to form at least one junction between the filament and the metal member.

The invention will now be explained below in detail.

Figure 9A:
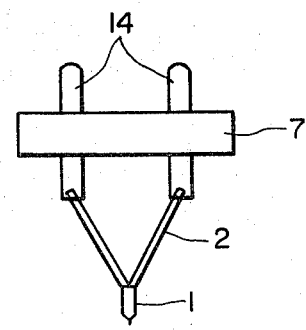
FIGS. 9A to 9C are diagrams illustrating the steps for producing field emission cathodes according to other embodiments of the present invention.
Figure 9B:
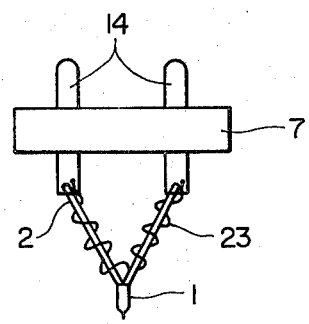
Figure 9C:
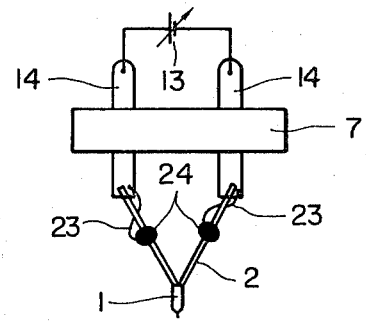

Tungsten or molybdenum is used as a material for constituting the field emission cathode. A polycrystalline wire of a diameter of 0.15 mm is formed into a filament 2 of the shape of a hairpin, and a <100> oriented single crystal is bonded to a central portion of the filament 2 and a tip portion thereof is electrolytically polished in an aqueous solution of NaOH to prepare the tip 1. FIG. 9A illustrates the above-mentioned state, in which reference numeral 1 denotes a tip of tungsten or molybdenum, 2 denotes a hairpin-shaped filament composed of a polycrystalline wire of tungsten or molybdenum, 14 denotes stems which are composed of a cobalt-nickel alloy and which are connected to the filament 2, and 7 denotes a glass base. Referring to FIG. 9B, an end of a hafnium wire 23 of a diameter of about 80 μm is spot-welded to the stem 14 and is wound around the hairpin-shaped filament 2, and another end thereof is spot-welded to another stem 14. The electric current is supplied from the power supply 13 to the stems 14 under the high-vacuum condition, and the hafnium wire 23 is heated until it melts. As the hafnium wire melts, the temperature will be further raised instantaneously. This can be recognized by naked eyes. Hence, the flow of current should be stopped when the hafnium wire is melted. Thus, the field emission cathode of the shape shown in FIG. 9C is prepared. That is to say, the hafnium wire 23 is melted nearly at a central portion in the hairpin portion of the filament 2 to form a spherical dispensing source 24. The hafnium wire 23 on the side of the stem 14 is not melted but remains being connected to the stem 14 in the form of a wire. The moment at which the hafnium wire 23 is melted can be recognized by naked eyes as mentioned above. When the hafnium wire is heated by using a constant-voltage supply 13, the moment at which the wire melts can be easily recognized from the change in current.

The hafnium wire 23 needs not necessarily be melted to form a spherical dispensing source 24; at least one junction portion should be formed between the filament 2 and the hafnium wire 23. In short, the junction portion exhibits the same function as the dispensing source 24.

Further, both ends of the hafnium wire 23 need not necessarily be spot-welded to the stems 14, 14, but may be in a free state. In this case, the junction portion between the filament 2 and the hafnium wire 23 is formed by heating the filament 2 by the electric current. The hafnium wire 23 may be heated by another power supply. Moreover, the hafnium wire may be heated not by the electric current but by a gas burner or the like.

The hafnium wire 23 needs not be wound on all of the filament 2 but may be wound on one side thereof only. In this case, only one junction portion or dispensing source will be formed.

Figure 10:
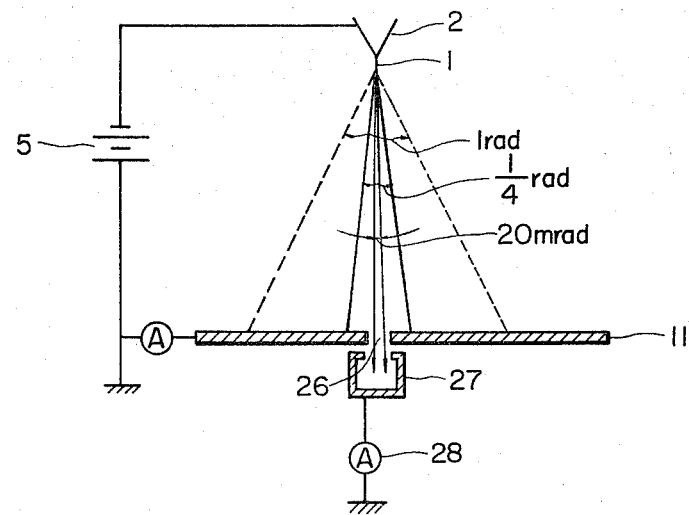
FIG. 10 is a diagram illustrating the setup of a properties measurement system of the field emission cathode of FIG. 9C.

The field emission cathode constructed as shown in FIG. 9C is disposed in a high vacuum chamber as shown in FIG. 10 to measure fundamental properties of the field emission. When the field emission cathode of FIG. 9C is heated in vacuum, the dispensing source 24 of hafnium is diffused onto the surface of the hairpin-shaped filament 2 made of tungsten or molybdenum to cover the surface of the single crystalline tip 1. Referring to FIG. 10, when the electric current is supplied to the filament 2 to heat the tip 1 at about 1400° C. while a high voltage is applied to the filament 2 from the power supply 5, there is obtained a field emission electron micrograph on an anode plate 11 of which the surface is coated with a fluorescent material. A small hole 26 is formed in the center of the anode plate 11 to see an aperture angle of 20 mrad. from the tip 1, and the electrons incident upon the small hole 26 are captured by a Faraday cage 27 to measure it by a micro-ammeter 28.

Figure 11:
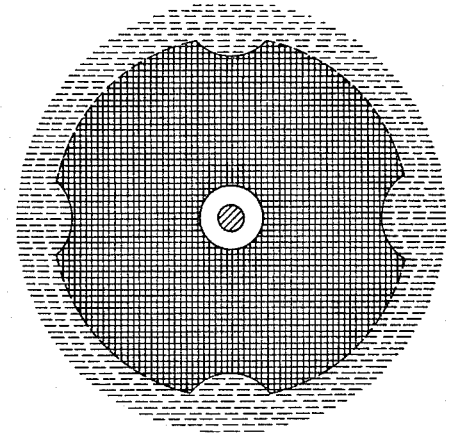

When the oxygen gas is introduced to reduce the emission angle and partial pressure of oxygen gas is adjusted to be $1.5 \times 10^{-7}$ Torr, the work function is minimized, and the field emission electron micrograph having reduced emission angle as shown in FIG. 11 is obtained. When the tip consists of a single crystal of tungsten only, the emission angle possesses an aperture angle of about 1 rad. as indicated by dotted lines of FIG. 10. In FIG. 11, the aperture angle is about ¼ rad. At a temperature of 1400° C., an electron micrograph (dotted lines in the lateral direction in FIG. 11) and field emission electron micrographs from four planes (100) on the side of the tip are observed in the region on the outer side of the aperture angle of 1 rad. though the current densities are very small. The central angular confined field emission electron micrograh has current densities in the ring-like circumferences which are two to four times greater than that of the central portion. The current, however, becomes stable toward the center by several times. In the case of this embodiment, the probe current is 1 μA as measured by the Faraday cage 27 when the total emission current is 200 μA (including thermal electrons of 50 μA on the outer side of the electron micrograph) as measured by the anode plate 11, which is equal to when the total emission current of about 1 mA is drawn by the above-mentioned <310> oriented tungsten tip. Further, although not specifically mentioned, the stability in current under this state is comparable to that of the emission of thermal electrons; ΔIp/Ip (variation ΔIp relative to the probe current Ip) is smaller than 1% when the probe current is 1 μA. Moreover, what makes the present invention strikingly different from the conventional field emission cathode is that the oxygen gas of the order of $10^{-7}$ Torr is introduced at all times to reduce the emission angle and to increase the stability. The ratio of the thermal electron emission current contained in the total emission current increases as the cathode is operated at elevated temperatures. Therefore, although the ratio of angular confinement expressed by the ratio of the total emission current to the probe current may decrease apparently, there develops no problem since the object is to obtain a probe current of increased stability.

In the case of the tip having a reduced emission angle as shown in FIG. 11 and the smallest work function, there exists a correlation between the tip temperature and the partial pressure of oxygen. In the case of the hafnium tip, the pressure was $4 \times 10^{-8}$ Torr when the tip temperature was 1200° C., $6 \times 10^{-8}$ Torr when the tip temperature was 1300° C., $2.8 \times 10^{-7}$ Torr when the tip temperature was 1500° C., and $1.5 \times 10^{-7}$ Torr when the tip temperature was 1400° C. In practice, however, there is no need of strictly maintaining the tip temperature and the oxygen partial pressure given by the correlation. Besides, the ratio of emission angle confinement does not contribute to increasing the stability of the probe current. Therefore, the cathode can be used over considerably wide ranges of tip temperature and oxygen partial pressure. However, when no oxygen gas is introduced (or when no partial pressure of oxygen gas is present as residual gas), hafnium only will be adhered onto the tungsten plane (100) as shown in FIG. 12A. FIG. 12C illustrates an angular confined field emission electron micrograph when the work function is minimal on the plane (100), FIG. 12B illustrates an angular confined field emission electron micrograph when the partial pressure of oxygen gas at a given tip temperature is smaller than that of FIG. 12C, and FIG. 12D illustrates an angular confined field emission electron micrograph when the partial pressure of oxygen gas is high. As shown in FIG. 11, the central plane (100) has a current density which is one-half to one-fourth that of the surrounding ring portion, but has quite excellent stability. Referring to FIGS. 12B to 12D, the thermal emission electron micrograph will appear as shown in FIG. 11 at a tip temperature of higher than 1400° C., but is not illustrated. FIG. 12E roughly indicates the intensities of current density.

The stability of current is not decreased even when gases other than the oxygen gas are made present. For example, when the air (containing oxygen, nitrogen, water and the like) is present as residual gas in an amount which corresponds to a pressure $4 \times 10^{-7}$ Torr, the cathode can be stably operated at a tip temperature of 1500° C. by introducing the oxygen gas is an amount which corresponds to a pressure $2 \times 10^{-7}$ Torr. Even in the ordinary field emission cathodes, characteristics are not adversely affected by such gases as carbon monoxide (CO) or carbon dioxide ($CO_2$).

A further embodiment deals with the case where zirconium is used instead of hafnium. The tip of the invention can be prepared quite in the same method as in FIGS. 9A to 9C. The heating temperature for preparing the tip in the steps of FIGS. 9B and 9C may be decreased by an amount which is equal to the difference between the melting point of hafnium and the melting point of zirconium. When the field emission is effected in the same manner as in FIG. 10, the field emission electron micrographs will be quite the same as those of FIG. 11 and FIGS. 12A to 12D. Further, the correlation between the tip temperature and the partial pressure of oxygen, which gives the minimum work function, will be almost equal to that of hafnium under the initial stage of use. However, as the cathode is used for 1 to 2 hours, the oxygen partial pressure may be reduced to $\frac{1}{3}$ to $\frac{1}{4}$ while the tip temperature is maintained constant. After the cathode is used for 3 to 4 hours, the oxygen partial pressure may be reduced to about 1/10 of the initial pressure. Under steady-state operation, the oxygen partial pressure needs be 1/10 to 1/100 as compared with the case of hafnium. This is presumably due to the fact that in the case of zirconium, the oxidation will have been advanced to some extent in the dispensing source of diffusion.

Still another embodiment of the invention deals with the case where titanium is employed. In this case, also, the cathode tip is prepared in the same way as when zirconium or hafnium is used. A great advantage brought about by titanium, however, is that the cathode stably operates at a temperature of about 1100° C. without the need of particularly supplying oxygen.

Further, even when a binary alloy wire or a ternary alloy wire composed of hafnium, zirconium and titanium are used, or even when two or three metal wires consisting of hafnium, zirconium or titanium are used being intermingled together, the same effects will be obtained as mentioned above.

According to the embodiments of the present invention, the tip which is used as the field emission cathode needs, fundamentally, maintain the shape of FIG. 9C; the order for fabricating the tip is not much taken into account. Namely, the operations of FIGS. 9B and 9C may be performed prior to adhering a single crystalline wire 1 to the hairpin-shaped filament 2 of tungsten or molybdenum, or the single crystalline wire 1 may be adhered to the filament 2 followed by the electrolytic polishing, or the operations of FIGS. 9B and 9C may be performed after the single crystalline wire 1 has been adhered to the hairpin-shaped filament 2 followed by the electrolytic polishing.

Figure 13A:
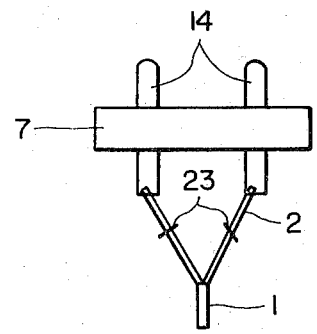
FIGS. 13A and 13B are diagrams illustrating the steps for producing field emission cathodes according to further embodiments of the present invention.
Figure 13B:
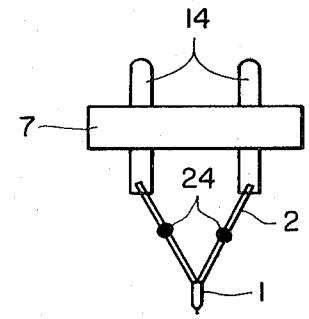

In addition to intermingling the wire of hafnium, zirconium or titanium around the hairpin-shaped filament 2, it is also allowable to join a wire 23 of hafnium, zirconium or titanium to one side or both sides of the hairpin-shaped filament 2 as shown in FIG. 13A, thereby to form a spherical dispensing source 24 as shown in FIG. 13B. The dispensing source needs not be formed in a spherical shape but may simply be attached to the filament. Furthermore, the single crystalline wire 1 is electrolytically polished to form the tip 1 before or after the spherical dispensing source is prepared.

According to the present invention, the tip temperature at which the current can be maintained stable ranges from 860° C. to 1500° C. even when hafnium, zirconium or titanium is used. The partial pressure of oxygen gas required at this moment may vary depending upon the tip temperature and the type of the tip as mentioned above, but should be selected to lie within a suitable range smaller than $5 \times 10^{-7}$ Torr depending upon the tip temperature and the type of the tip.

As for the life of the tip prepared according to the present invention, the hafnium tip exhibits the longest life, the zirconium tip the second longest life, and the titanium tip exhibits the third longest life, provided they are used at the same temperature. For example, the zirconium tip in the embodiment of FIG. 9C exhibits a life of longer than 10,000 hours when used at a temperature of 1500° C. Besides, the shape of the tip is not affected, and no problem is presented in practice. The lower limit of the operation temperature can be set to be the lowest for titanium, second lowest for zirconium, and least lowest for hafnium.

Further, the tip prepared according to the present invention is best suited when it is desired to obtain a great probe current having a spot diameter of about 0.1 $\mu$m as in the electron beam lithography instrument. The probe current having a variation (drift) in current level of less than 1% per hour and a variation (noise) of less than 1% within short periods of time, was obtained, which was superior to the stability ever attained by the conventional field emission cathodes.

According to the present invention as illustrated in detail in the foregoing, there is provided a field emission cathode which is essentially an electron source of high brightness, that produces a large probe current while maintaining excellent stability for extended periods of time as well as excellent life, without affected by the quality of vacuum (residual gases or the like).

What is claimed is:

1. A field emission cathode comprising a heating filament which is formed in the shape of a hairpin and which consists of a fine metal wire having resistance against high temperatures, and a tip which consists of a metal having resistance against high temperatures and which is joined to the top of said filament so that electrons are emitted from the tip thereof in the electric field, wherein in order to reduce the work function on the surface of said tip, a metal is adsorbed via oxygen onto the surface of said tip to a thickness which does not exceed the thickness of the monolayer of atoms, said metal having a work function which is smaller than the work function of the metal forming said tip, and an oxide of said metal having resistance against high temperatures, wherein said metal is at least one which is selected from the group consisting of chromium, aluminum, cerium, magnesium and titanium.

2. A field emission cathode according to claim 1, wherein said tip consists of a single crystal of tungsten or molybdenum.

3. A field emission cathode according to claim 2, wherein the single crystal constituting the tip is a <100> oriented crystal.

4. A field emission cathode according to claim 1, wherein said adsorbed metal in the adsorbed layer is directly deposited by vaporization on the surface of said tip.

5. A field emission cathode according to claim 1, wherein the adsorbed metal in the adsorbed layer is supplied from the metal which is joined to said filament.

6. A field emission cathode according to claim 5, wherein the adsorbed metal in said adsorbed layer is titanium.

7. A method of fabricating a field emission cathode comprising:
- a step for forming a filament by forming a fine metal wire having resistance against high temperatures into the shape of a hairpin;
- a step for joining a tip of a metal having resistance against high temperatures to a vicinity of the top of said filament;
- a step for vaporizing a metal onto the surface of said tip in a vacuum atmosphere where the field can be emitted, at least to a thickness equal to the thickness of the monolayer of atoms, said metal having a work function which is smaller than the work function of the metal forming the tip, and an oxide of said metal having resistance against high temperatures;
- a step for adsorbing oxygen onto the surface of said tip to a thickness equal to the thickness of the monolayer of atoms by introducing a suitable amount of oxygen gas into said vacuum atmosphere;
- a step for evacuating said oxygen gas to establish again the vacuum atmosphere where the field can be emitted; and
- a step for heating said tip at a temperature of 1300° to 1500° C. for 10 to 60 seconds.

8. A method of fabricating a field emission cathode according to claim 7, wherein there is included a step for heating said tip to a suitable temperature between said step of adsorption and said step of evacuation.

9. A method of fabricating a field emission cathode according to claim 7, wherein said step of junction and said step of deposition by vaporization employ a single crystal of tungsten or molybdenum as said tip, as well as at least one metal selected from the group consisting of chromium, aluminum, cerium, magnesium, titanium, silicon, zirconium and hafnium as a metal that is to be deposited by vaporization.

10. A method of fabricating a field emission cathode according to claim 9, wherein a $<100>$ oriented crystal is used as said single crystal.

11. A method of fabricating a field emission cathode according to claim 7, wherein the step for vaporizing comprises positioning a member made of said metal near said tip and passing an electric current through said member to heat said member so that said metal is vaporized onto said tip.

12. A method of fabricating a field emission cathode according to claim 7, wherein the step for vaporizing comprises positioning a member having a coating of said metal thereon near said tip and passing an electric current through said member to heat said member so that said metal is vaporized onto said tip.

13. A method of fabricating a field emission cathode comprising:
- a step for forming a filament by forming a fine metal wire having resistance against high temperatures into the shape of a hairpin;
- a step for joining a tip of a metal having resistance against high temperatures to a vicinity of the top of said filament;
- a step for joining a metal member to said filament, said metal member having a work function which is smaller than the work function of the metal forming said tip, and an oxide of said metal member having resistance against high temperatures; and
- a step for heating said tip at a temperature of 860° to 1500° C. in a vacuum atmosphere where the field can be emitted in which is introduced the oxygen gas while maintaining the partial pressure of the oxygen gas to be smaller than $5 \times 10^{-7}$ Torr.

14. A method of fabricating a field emission cathode according to claim 13, wherein said tip is joined after said metal member has been joined.

15. A method of fabricating a field emission cathode according to claim 13, wherein said step of joining said tip and said step of joining said metal member employ a single crystal of tungsten or molybdenum as said tip, as well as at least one metal member selected from the group consisting of titanium, zirconium and hafnium as said metal member.

16. A method of fabricating a field emission cathode according to claim 15, wherein a $<100>$ oriented crystal is used as said single crystal.

17. A method of fabricating a field emission cathode comprising:
- a step for forming a filament by forming a fine metal wire having resistance against high temperatures into the shape of a hairpin;
- a step for joining a tip of a metal having resistance against high temperatures to a vicinity of the top of said filament;
- a step of immersing said tip in an aqueous solution of a water-soluble compound including a metal and oxygen, said metal having a work function which is smaller than the work function of the metal forming said tip, and an oxide of said metal having resistance against high temperatures; and
- a step of heating said tip at a temperature of 1300° to 1500° C. in a vacuum atmosphere to decompose said water-soluble compound so that said metal is formed on the tip.

18. A method of fabricating a field emission cathode according to claim 17, wherein said water-soluble compound is a nitrate or carbonate of said metal.

* * * * *